United States Patent [19]

Amann

[11] Patent Number: 4,682,337
[45] Date of Patent: Jul. 21, 1987

[54] LASER DIODE WITH BURIED ACTIVE LAYER AND LATERAL CURRENT LIMITATION BY USE OF A SELF-ADJUSTED PN-JUNCTION

[75] Inventor: Markus-Christian Amann, Munich, Fed. Rep. of Germany

[73] Assignee: Siemens Aktiengesellschaft, Berlin and Munich, Fed. Rep. of Germany

[21] Appl. No.: 776,156

[22] Filed: Sep. 13, 1985

[30] Foreign Application Priority Data

Sep. 25, 1984 [DE] Fed. Rep. of Germany ....... 3435148

[51] Int. Cl.⁴ ............................................... H01S 3/19
[52] U.S. Cl. ......................................... 372/44; 372/45
[58] Field of Search ....................... 372/43, 44, 45, 46, 372/48

[56] References Cited

U.S. PATENT DOCUMENTS 4,426,700  1/1984  Hirao et al. ............................ 372/44

Primary Examiner—Gene Wan
Attorney, Agent, or Firm—Hill, Van Santen, Steadman & Simpson

[57] ABSTRACT

A laser diode has regions laterally flanking a strip-shaped laser junction. In these regions a pn-junction inhibiting the laser current is generated by a re-doping which has been created by dopant diffusion from a given layer through an adjoining, further layer into another layer spaced from the given layer by the further layer.

16 Claims, 7 Drawing Figures

LASER DIODE WITH BURIED ACTIVE LAYER AND LATERAL CURRENT LIMITATION BY USE OF A SELF-ADJUSTED PN-JUNCTION

BACKGROUND OF THE INVENTION

The present invention relates to a laser diode with a laser-active strip in a buried layer of a hetero-layer structure of III-V semiconductor material.

Laser diodes of the type having a buried active layer (buried hetero-layer) like the laser diode of the present invention are disclosed, for example, by U.S. Pat. No. 4,426,700 and by IEEE Journal of Quantum Electronics, Volume QE 15 (1979), pages 451 through 469, both incorporated herein by reference. The latter publication is involved with a discussion of the theoretical questions. The concern here is laser diodes in a semiconductor body having a hetero-layer structure. In order to achieve the lowest threshold currents, the spatial arrangement is undertaken such that the active layer, which has the form of a narrow strip also referred to as a ridge, is situated within the layer structure, i.e. is buried. This narrow strip is flanked by semiconductor material having a lower refractive index and a higher band gap. The arrangement is designed such that the supplied electrical current for generating the laser radiation is concentrated on this narrow strip and leakage currents which occur are suppressed by shunts in the proximity of the active strip. Insulating layers have been employed, on the one hand, for the suppression of such leakage currents. It is also known to employ inhibiting pn-junctions for this purpose, whereby the problem always exists that the electrical current flowing through the active strip is undesirably deteriorated. The occurrence of such influences can in fact be avoided by the topically selective growth of pn-junction layers next to the active strip. This is a very involved manufacturing method, however.

For the sake of completeness, it should be pointed out that another type of laser (gain-guided) which does not have lateral zones with lower refractive index and higher band gap is known, for example, in German OS No. 28 19 843 and in Appl. Phys. Lett., Volume 43 (1983), pages 809 through 811 as well as Volume 4 (1984), pages 1035 through 1037, all incorporated herein by reference.

SUMMARY OF THE INVENTION

An object of the present invention is to specify a laser diode of the type having a buried, strip-shaped active layer wherein the laterally disposed pn-junction which serves for limiting the current to the active strip can be applied in a simple fashion, and nonetheless does not effect any influencing of the current flowing through the active strip and which serves the purpose of generating the laser radiation.

This object is achieved with a laser diode wherein the laterally disposed pn-junction is created in self-adjusting fashion and limits the current to the active strip. The inhibiting pn-junction is created by a re-doping technique through dopant diffusion from a given layer through an adjoining further layer into another layer spaced from the given layer by the further layer.

A method for manufacturing a laser diode having a buried active layer and including lateral regions with lower refractive index and higher band space has been discosed in U.S. Pat. No. 4,426,700 wherein the hetero-layer structure of the diode has first been generated in surface-wide fashion on a substrate body and the ridge containing the narrow strip of the active layer has then been produced by masked etching, i.e. by etching the lateral zones away. Only thereafter are these zones to the side of the ridge again newly filled with epitaxially deposited semiconductor material. These techniques are involved and it is also difficult to guarantee the precise position of a pn-junction which is to be produced in this context with this re-filling, and which is to extend laterally of the ridge.

An idea fundamental to the invention is to dimension or design individual method parameters of the manufacturing method of a diode of the invention such that the desired pn-junction basically results during the course of the manufacturing method. Particularly provided in the invention is that this pn-junction arises in self-adjusting fashion. A layer is provided in the laser diode of the invention which contains a highly diffusing dopant which diffuses into another of the layers of the layer structure during the course of a heat treatment or tempering process and effects re-doping there. This other layer is separated from the former layer originally only containing the dopant, and is separated therefrom by an intervening, further layer of the overall layer structure. Also according to the invention, however, it is desired to select and dimension doping of this further layer relative to the former layer such that it is oppositely doped with respect to this former layer. The degree of doping of this further layer is selected such that the conductivity type is not altered during the out-diffusion of the dopant from the former layer during the thermal treatment. Furthermore, the dimensions are also selected such that a portion of the dopant diffusing through this further layer into the other layer causes a re-doping in this other layer at least in the boundary region between the other layer and the further layer. This causes a re-doping such that a pn-junction arises between the re-doped part of the other layer and the further layer which has still remained unaltered in terms of its doping type. Furthermore, the dimensions, particularly those relating to degrees of doping, are undertaken such that no re-doping occurs for the layers of the buried laser zone corresponding to the laser-active strip.

DESCRIPTION OF THE PREFERRED EMBODIMENTS

Figure 1:
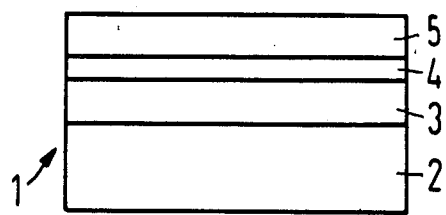
FIGS. 1 through 3 show method steps for the manufacture of a first embodiment of the invention.

FIG. 1 shows a hetero-layer structure as is usually fundamentally employed for lasers having a buried active layer. A semiconductor substrate which, for example, is composed of pn-conductive indium phosphide, is referenced 2. The first layer 3 situated thereon is composed, for example, of p-conductive indium phosphide which, in accordance with the invention, is doped with a dopant having a high diffusion coefficient, i.e. exhibits a highly diffusing tendency. Such a dopant is, in particular, zinc. Cadmium and/or magnesium, however, also may be employed for this purpose. The second layer 4 is composed, for example, of indium gallium arsenide phosphide. It is the actual active layer and is preferably undoped. The third layer 5 is composed, for example, of n-conductive indium phosphide. A dopant having (in comparison to that of the layer 3) a less high, and particularly a very low diffusion coefficient, is employed for this layer. This layer structure thus contains a pn-junction polarized in a forward direction during operation of the laser diode.

Figure 2:
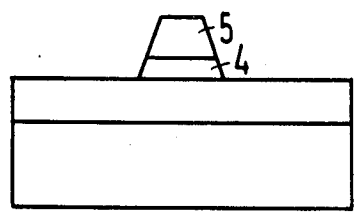

FIG. 2 shows the result of an etching process with the assistance of which the standard, strip-shaped structure of the layers 4 and 5, i.e. of the laser-active zone of the layer 4 and of the adjacent contact layer 5, is produced.

Figure 3:
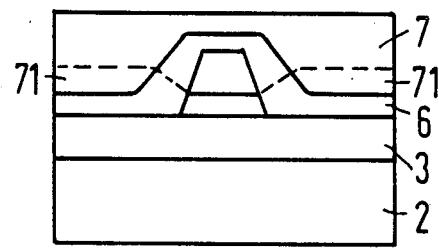

FIG. 3 shows two further fourth and fifth layers 6 and 7 which have been additionally applied. The layer 6, referred to above as the fourth or further layer, is formed, for example, of n-conductive indium phosphide. It is preferably doped with only a weakly diffusing dopant, for example tin, tellurium, or germanium. The next following layer 7, referred to above as the fifth or other layer, is again n-conductive and is likewise formed, for example, of indium phosphide and a weakly diffusing dopant.

It is also important for the invention that the degree of doping of the further layer 6 is sufficiently higher than that of the other layer 7 such that, given for example the dopant zinc contained in layer 3, a diffusing into the layers 6 and 7 from the former layer 3 during the thermal treatment does not yet effect a re-doping in the further layer 6, but does in fact redope the zone of layer 7 referenced 71 in the layer 7. This layer 7 extends at the right and left of the strip-shaped active layer 4. As viewed from the zone 71, which has become p-conductive due to the additional zinc doping, the layer 6 which continues to remain n-conductive, follows. This layer 6 is followed by the p-conductive layer 3. A pnp-junction is thus present from the zone 71 to the layer 3, this pnp-junction containing a pn-junction next to the laser strip which has a stopping effect for the current. As a consequence of the overall manufacturing method of the laser diode of the invention, this inhibiting pn-junction has arisen in self-adjusting fashion.

The process of thermal treatment can be separately executed. However, the thermal treatment can also already be a part of the epitaxy method of the layers 6 and 7, i.e. the diffusion of the zinc can already occur while the layers 6 and 7 are arising.

Figure 4:
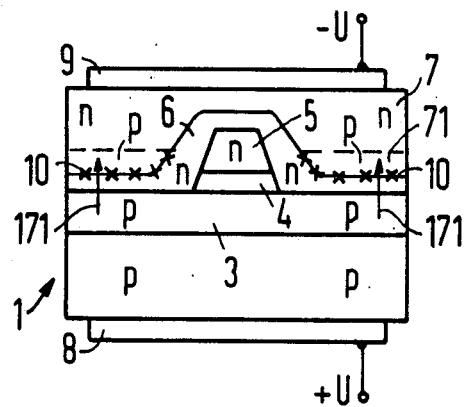
FIG. 4 shows a finished example of this first embodiment.

FIG. 4 shows a finished laser diode manufactured in accordance with the method steps of FIGS. 1 through 3. It is additionally provided with the electrodes 8 and 9 which serve for the connection of the electrical feed voltage. It may be seen from the dopings indicated in this Figure (these dopings to be interpreted as an example) that the pn-junction polarized in the forward direction is present in unaltered fashion in the region of the laser-active strip, as desired. The inventively manufactured, inhibiting pn-junctions 10 (emphasized with crosses in the Figure) lie at the right and left of this strip-shaped zone 4. These pn-junctions 10 cause the current flux to be restricted to the strip-shaped laser-active zone. The manufacturing method of the invention can also be perceived at the finished laser diode of FIG. 4, namely on the basis of the distributions of the dopings and the dimensionings of the dopings relative to one another which are characteristic of the invention.

Figure 5:
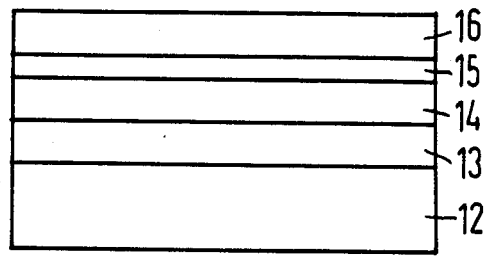
FIGS. 5 and 6 show method steps relating to a second embodiment of the invention.
Figure 6:
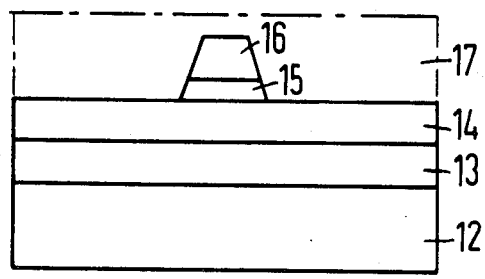
Figure 7:
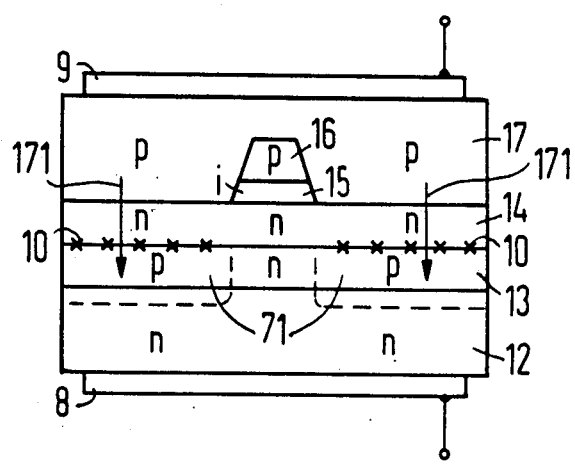
FIG. 7 shows a laser diode of this second embodiment.

FIGS. 5 through 7 show the method steps of a further manufacturing method of the invention. The semiconductor substrate is referenced 12. It is n-conductive and is formed, for example, of indium phosphide. The following, first layer 13 is likewise n-conductive, for example, tin-doped indium phosphide. The next, following second layer 14 is n-conductive and, for example, is again tin-doped indium phosphide, but has a higher doping degree in comparison to the layer 13. The next, following third layer 15 is the actual active layer (comparable to the layer 4) composed, for example, of indium gallium arsenide phosphide which, for example, is undoped. The next, following fourth layer 16 is p-conductive, for example zinc-doped indium phosphide.

FIG. 6 shows the result of the etching step with the strip-shaped structure of the active zone 15 and 16 as seen in the Figure.

With broken lines, FIG. 7 also shows the application of a mixed layer 17 which is that layer which contains the inventively provided dopant having a high diffusion coefficient. In this example, this dopant causes a p-conduction, particularly zinc, cadmium or magnesium. Also according to the invention, the doping degree of the layer 14 which is n-conductive here is selected so much higher than that of the likewise n-conductive layer 13 that p-dopant from the layer 17 diffusing into and through the layer 14 (during a corresponding thermal treatment) does not change the conductivity type of this layer 14, but does in fact alter the conductivity of the layer 13.

FIG. 7 shows the result of the inventive manufacturing method, namely the laser diode of the second exemplary embodiment provided with the electrodes 8 and 9. Just like the laser diode of FIG. 5, the laser diode of FIG. 8 has a pnp-structure with an inhibiting pn-junction 10 outside of the actual laser-active zone of the strips 3 and 4. Dimensions corresponding to the invention shall be provided below for the two exemplary embodiments.

First Exemplary Embodiment:

Layer 3: p-InP; Zn doped, for example $P_3 = 1$ through $10 \times 10^{17} \text{cm}^{-3}$;

Layer 4: InGaAsP (active layer; for example undoped)

Layer 5: n-InP; Sn doped, for example $N = 2 \times 10^{18} \text{cm}^{-3}$

Layer 6: n-InP; Sn doped, for example $N_6 = 2 \times 10^{18} \text{cm}^{-3}$

Layer 7: n-InP; Sn doped, for example $N_7 = 5 \times 10^{16} \text{cm}^{-3}$ thus $n_6 \; P_3 \; N_7$ as well as $N_5 \; P_3$ Second Exemplary Embodiment:

Layer 13: n-InP; Sn doped, for example $N_{13} = 2 \times 10^{17} \text{cm}^{-3}$ Layer 14: n-InP; Sn doped, for example $N_{14} = 2 \times 10^{18} \text{cm}^{-3}$ Layer 15: InGaAsP (active layer; for example undoped)

Layer 16: p-InP; Zn doped, for example $P_{16} = 1 \times 10^{17} \text{cm}^{-3}$ Layer 17: p-InP; Zn doped, for example $P_{17} = 5 \times 10^{17} \text{cm}^{-3}$— thus $N_{14} \; P_{17} \; N_{13}$ as well as $N_{14} \; P_{16}$ Although various minor changes and modifications might be proposed by those skilled in the art, it will be understood that I wish to include within the claims of the patent warranted hereon all such changes and modifications as reasonably come within my contribution to the art.

I claim as my invention:

1. A method for producing a laser diode having a laser-active strip in a buried layer of a hetero-layer structure of III-V semiconductor material wherein the buried layer is flanked by an inhibiting pn-junction such that a current limitation to the laser-active strip results, comprising the steps of:
   providing a first semiconductor layer of first conductivity type and doped with a re-doping dopant of relatively high diffusion coefficient;
   providing a second layer on the first layer which will become the laser-active strip;
   providing a third semiconductor layer of second conductivity type on the second layer and having a dopant with a relatively low diffusion coefficient compared to the re-doping dopant;
   structuring the second and third layers so as to create the laser-active strip with a layer lying thereover;
   providing a fourth semiconductor layer of second conductivity type having a relatively weakly diffusing dopant compared to the re-doping dopant over the second and third layers and on the first layer where the second and third layers have been removed;
   providing a fifth semiconductor layer of second conductivity type similarly doped like the fourth layer with a dopant of a low diffusion coefficient relative to the re-doping dopant but a degree of doping of the fourth layer being sufficiently higher than a degree of doping of the fifth layer such that given a re-doping of zones of the fifth layer by the high diffusion coefficient dopant of the first layer, the fourth layer still remains of second conductivity type at regions where the re-doping dopant diffuses through; and
   creating a re-doped zone by diffusing the re-doping high diffusion coefficient dopant from the first layer through the fourth layer and into zones of the fifth layer so as to convert said zones of the fifth layer from second conductivity type to first conductivity type and thus create said inhibiting pn-junction flanking the laser-active strip and between portions of the fourth and fifth layers.

2. A method according to claim 1 wherein the re-doping dopant of high diffusion coefficient is one of the elements selected from the group consisting of zinc, cadmium, or magnesium.

3. A method according to claim 1 wherein the dopant of second conductivity type of the fourth and fifth layers having a low diffusion coefficient is one of the elements selected from the group consisting of tin, tellurium, or germanium.

4. A method according to claim 1 wherein the laser-active strip is shaped by etching.

5. A method according to claim 1 including the step of situating said re-doped zones in the fifth layer such that it is separated from the hetero-structure including the laser-active strip by the fourth layer.

6. A method according to claim 1 wherein the step of diffusing the high diffusion coefficient re-doping dopant occurs during formation of the fourth and fifth layers.

7. A method according to claim 1 including the step of diffusing the re-doping dopant of high diffusion coefficient by heat out of the first layer through the fourth layer and into the fifth layer.

8. A method for producing a laser diode with a laser-active strip in a buried layer of a hetero-layer structure of III-V semiconductor material wherein the buried layer is flanked by an inhibiting pn-junction such that a current limitation to the laser-active strip results, comprising the steps of:
   providing a first semiconductor layer of first conductivity type;
   providing a second semiconductor layer of first conductivity type on the first layer, but having a higher doping degree than the first layer, a dopant of the first and of the second layers having relatively low diffusion coefficients;
   providing a third semiconductor layer on the second layer as the laser-active strip;
   providing a fourth semiconductor layer of second conductivity type on the third layer and having a dopant of relatively low diffusio coefficient;
   shaping the third and fourth layers so as to provide a desired shape of the laser-active strip formed of the third layer with the fourth layer thereon;
   applying a fifth semiconductor layer over the structured third and fourth layers and on the second layer where portions of the third and fourth layers are removed, said fifth layer comprising a mixed layer having a re-doping dopant of second conductivity type with a relatively high diffusion coefficient relative to the dopants of low diffusion coefficient;
   a doping degree of a dopant of the first conductivity type second layer being selected sufficiently higher than that of the first conductivity type first layer such that the re-doping dopant when passing through the second layer does not change the conductivity type of the second layer but does change the conductivity type of zones of the first layer; and
   diffusing the high diffusion coefficient re-doping dopant of second conductivity type from the fifth layer through the second layer to zones of the first layer so as to change the conductivity type of the first layer thereat from first conductivity type to second conductivity type and thus create the inhibiting pn-junction flanking the laser-active strip between the first and second layers.

9. A method according to claim 8 wherein the re-doping dopant of high diffusion coefficient is one of the elements selected from the group consisting of zinc, cadmium, or magnesium.

10. A method according to claim 8 wherein the first and second layer dopant of first conductivity type having a low diffusion coefficient is one of the elements selected from the group consisting of tin, tellurium, or germanium.

11. A method according to claim 8 wherein the laser-active strip is shaped by etching.

12. A method according to claim 8 including the step of situating said re-doped zones in the first layer such that it is separated from the hetero-structure including the laser-active strip by the second layer.

13. A method according to claim 8 including the step of diffusing the re-doping dopant of high diffusion coefficient by heat out of the first layer through the fourth layer and into the fifth layer.

14. A laser diode, comprising:
   a semiconductor substrate of first conductivity type having a first electrode connected thereto;
   a first semiconductor layer of first conductivity type on the substrate;
   a second semiconductor layer forming a strip-shaped laser active zone on the first layer;

a strip-shaped third semiconductor layer of second conductivity type overlying the second layer laser-active zone;

a fourth semiconductor layer of second conductivity type having a re-doped zone of first conductivity type at each side of the laser-active zone and separated from the laser-active zone and third layer by portions of the fourth layer and separated from the first layer by portions of the fourth layer; and a second electrode connecting to the fourth layer.

15. A laser diode according to claim 14 wherein a fifth layer of second conductivity type is provided on the fourth layer and the second electrode connects to the fifth layer through the fourth layer.

16. A laser diode, comprising:

a substrate of first conductivity type having a first electrode connected thereto;

a first semiconductor layer of first conductivity type on the substrate;

a second semiconductor layer of first conductivity type on the first layer;

a third semiconductor layer comprising a laser-active zone on the second layer;

a fourth semiconductor layer of second conductivity type overlying the third layer laser-active zone;

a fifth semiconductor layer of said second conductivity type overlying the third and fourth layers and also portions of the second layer;

a re-doped zone of second conductivity type laterally outwardly at each side of the strip-shaped laser-active zone and in the first layer, said re-doped zones being separated from the laser-active zone and the fifth layer by portions of the second layer; and a second electrode connecting to the fifth layer.

* * * * *